US008766920B2

(12) United States Patent
Wang et al.

(10) Patent No.: US 8,766,920 B2
(45) Date of Patent: Jul. 1, 2014

(54) DATA INPUTTING APPARATUS AND ELECTRONIC APPARATUS

(75) Inventors: William Wang, Taoyuan (TW); Meng Shin Yen, Taipei (TW); Chung Cheng Chou, Taoyuan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 973 days.

(21) Appl. No.: 12/721,217

(22) Filed: Mar. 10, 2010

(65) Prior Publication Data

US 2010/0277413 A1    Nov. 4, 2010

(30) Foreign Application Priority Data

Apr. 30, 2009  (TW) ............................... 98114451 A

(51) Int. Cl.
*G06F 3/02* (2006.01)
*G06F 3/042* (2006.01)
*G06F 3/033* (2013.01)

(52) U.S. Cl.
USPC ......... 345/168; 345/175; 345/184; 178/18.09

(58) Field of Classification Search
USPC ......... 345/156, 168–170, 173, 175, 177, 184; 178/18.09
See application file for complete search history.

(56) References Cited

U.S. PATENT DOCUMENTS

| 4,379,968 | A | * | 4/1983 | Ely et al. ........................ 250/229 |
| RE33,422 | E | * | 11/1990 | Garcia, Jr. ..................... 250/229 |
| 2006/0066576 | A1 | * | 3/2006 | Kong ............................. 345/168 |

* cited by examiner

*Primary Examiner* — Lun-Yi Lao
*Assistant Examiner* — Jarurat Suteerawongsa

(57) ABSTRACT

A data inputting apparatus includes a plurality of keyswitches, an optical module, a sensing module and a processing module. The keyswitches are disposed on the data inputting apparatus. The optical module is disposed on a first side of the data inputting apparatus and is used for emitting a plurality of lights along a first direction, and the lights are corresponding to the keyswitches respectively. The sensing module is disposed on a second side opposite to the first side and is used for receiving the lights and generating a sensing result. The processing module is coupled to the sensing module. When one of the keyswitches is pressed, one of the lights is blocked by the pressed keyswitch resulting in the sensing module adjusting the sensing result, and the position of the pressed keyswitch is determined by the processing module based on the sensing result.

2 Claims, 5 Drawing Sheets

DATA INPUTTING APPARATUS AND ELECTRONIC APPARATUS

BACKGROUND OF THE INVENTION

1. Field of the Invention

The invention relates to a data inputting apparatus, and more particularly, the invention relates to a data inputting apparatus capable of easily detecting the press on the keyswitch through the light emitting unit and the photoelectrical sensing unit.

2. Description of the Prior Art

In general, when the user operates the portable electronic apparatus such as notebook, the keyboard is usually used for inputting the data. However, the traditional keyboard has complex and large construction and circuit under the keyswitches, so that the volume of the notebook could not be decreased effectively to reduce the portability.

In the prior art, the touch keyboard can solve the space problem of the traditional keyboard. However, the users have used the traditional mechanical keyboard for a long time and the touch keyboard lacks the feeling of pressing the traditional keyboard having, therefore, the touch keyboard can not replace the traditional keyboard up to now.

Therefore, the invention provides a data inputting apparatus and an electronic apparatus for solve the above-mentioned problem.

SUMMARY OF THE INVENTION

A scope of the invention is to provide a data inputting apparatus capable of easily detecting the press on the keyswitch through the light emitting unit and the photoelectrical sensing unit.

According to an embodiment of the invention, the data inputting apparatus includes a plurality of keyswitches, a first optical module, a first sensing module, and a processing module. The keyswitches, having a protruding structure respectively, are disposed on the data inputting apparatus. The first optical module is disposed on a first side of the data inputting apparatus and used for emitting a plurality of first lights, corresponding to the keyswitches respectively, along a first direction. The first sensing module is used for receiving the first lights and generating a first sensing result based on a first receiving state for the first lights. The processing module is coupled to the first sensing module.

When a first keyswitch of the keyswitches is pressed, the protruding structure of the first keyswitch blocks at least one of the lights resulting in the first sensing state changing. The first sensing module adjusts the first sensing result based on the first receiving state, and then the processing module determines the position of the first keyswitch based on the first sensing result.

According to another embodiment of the invention, the electronic apparatus includes an input module, a first optical module, a first sensing module, and a processing module. The input module includes a plurality of keyswitches having a protruding structure respectively. The first optical module is disposed on a first side of the input module and used for emitting a plurality of first lights, corresponding to the keyswitches respectively, along a first direction. The sensing module is used for receiving the first lights and generating a first sensing result based on a first receiving state for the first lights. The processing module is coupled to the first sensing module.

When a first keyswitch of the keyswitches is pressed, the protruding structure of the first keyswitch blocks at least one of the lights resulting in the first sensing state changing. The first sensing module adjusts the first sensing result based on the first receiving state, and then the processing module determines the position of the first keyswitch based on the first sensing result.

These and other features, aspects, and advantages of the present invention will become better understood with regard to the following description, appended claims, and accompanying drawings.

BRIEF DESCRIPTION OF THE APPENDED DRAWINGS

DETAILED DESCRIPTION OF THE INVENTION

The invention provides a data inputting apparatus capable of detecting the keyswitch pressed by the user through the light emitting unit and the photoelectrical sensing unit. The complex and large construction and circuit under the keyswitches are unnecessary in the data inputting apparatus to simplify the construction and save the cost.

Figure 1A:
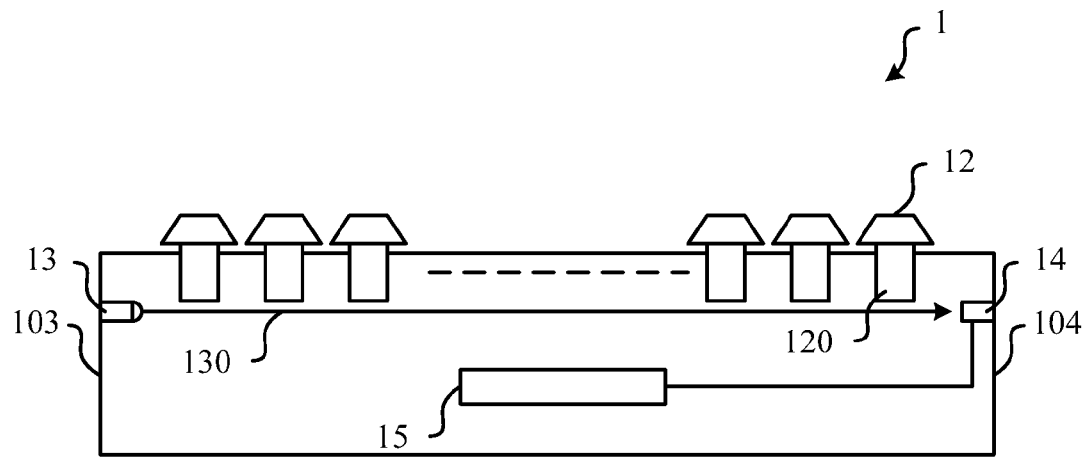
FIG. 1A is a sectional diagram illustrating a data inputting apparatus before operating according to an embodiment of the invention.

Please refer to FIG. 1A. FIG. 1A is a sectional diagram illustrating a data inputting apparatus 1 before operating according to an embodiment of the invention. As shown in FIG. 1A, the data inputting apparatus 1 includes keyswitches 12, a first optical module 13, a first sensing module 14, and a processing module 16, wherein the processing module 16 is coupled to the first sensing module 14. The keyswitches 12 are disposed on the data inputting apparatus, wherein the keyswitches respectively have a protruding structure 120. The first optical module 13 is disposed on a first side 103 of the data inputting apparatus 1 and used for emitting first lights 130 along a first direction.

The first sensing module 14 is disposed on a second side 104 opposite to the first side 103 of the data inputting apparatus 1 and used for generating a first sensing result based on a first receiving state for the first lights 130.

Figure 1B:
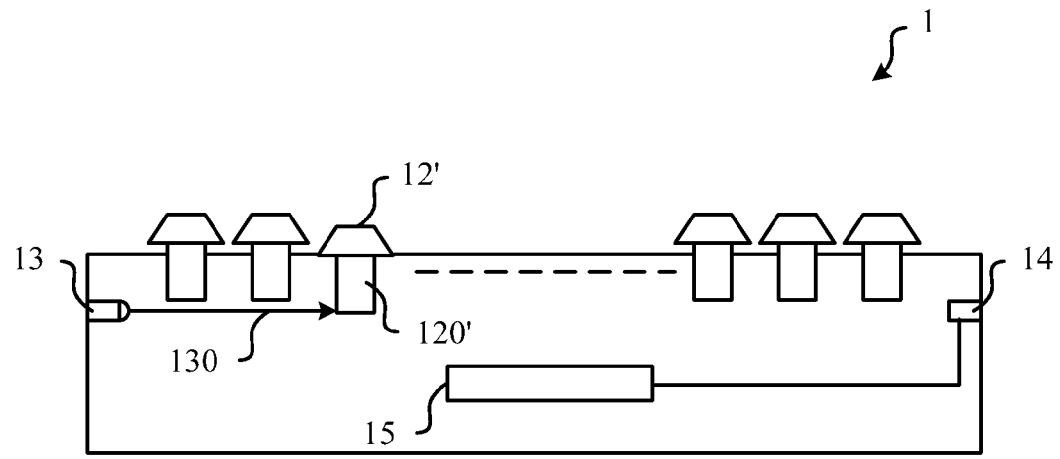
FIG. 1B is a sectional diagram illustrating the data inputting apparatus in FIG. 1 on operating.

Please refer to FIG. 1B. FIG. 1B is a sectional diagram illustrating the data inputting apparatus 1 in FIG. 1 on operating. As shown in FIG. 1B, when a first keyswitch 12' of the keyswitches 12 is pressed, the protruding structure 120' of the first keyswitch 12' blocks the first light 130 emitted by the first optical module 13 resulting in the first receiving state of the first sensing module 14. At this time, the first sensing module 14 adjusts the first sensing result based on the first receiving state, and the processing further determines the position of the first keyswitch 12' based on the first sensing result.

Figure 2A:
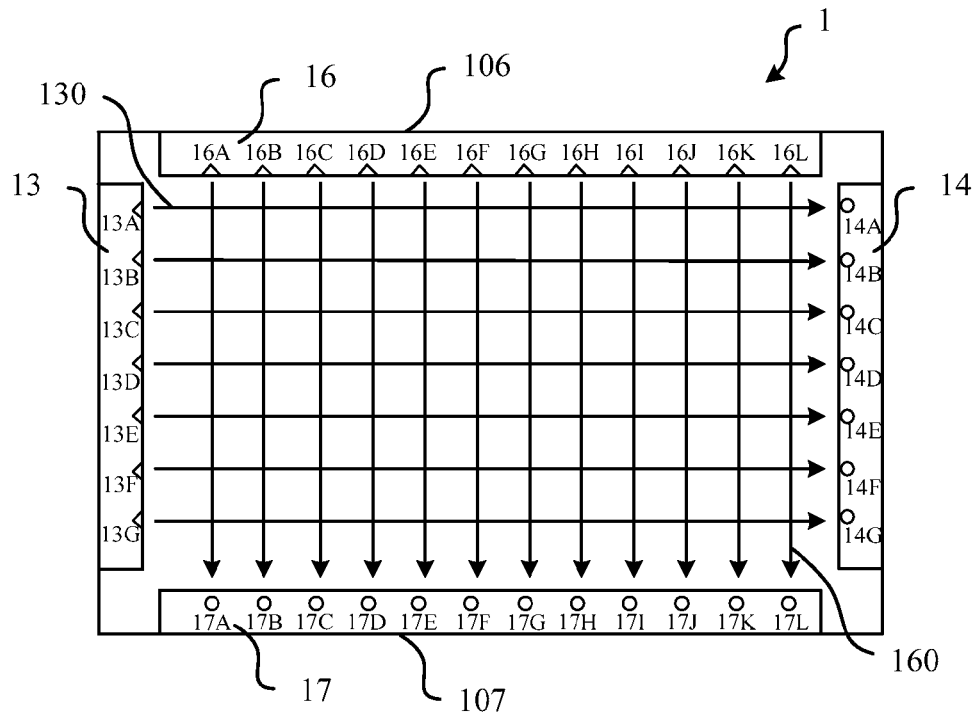
FIG. 2A and FIG. 2B are schematic diagrams illustrating the data inputting apparatus in FIG. 1.
Figure 2B:
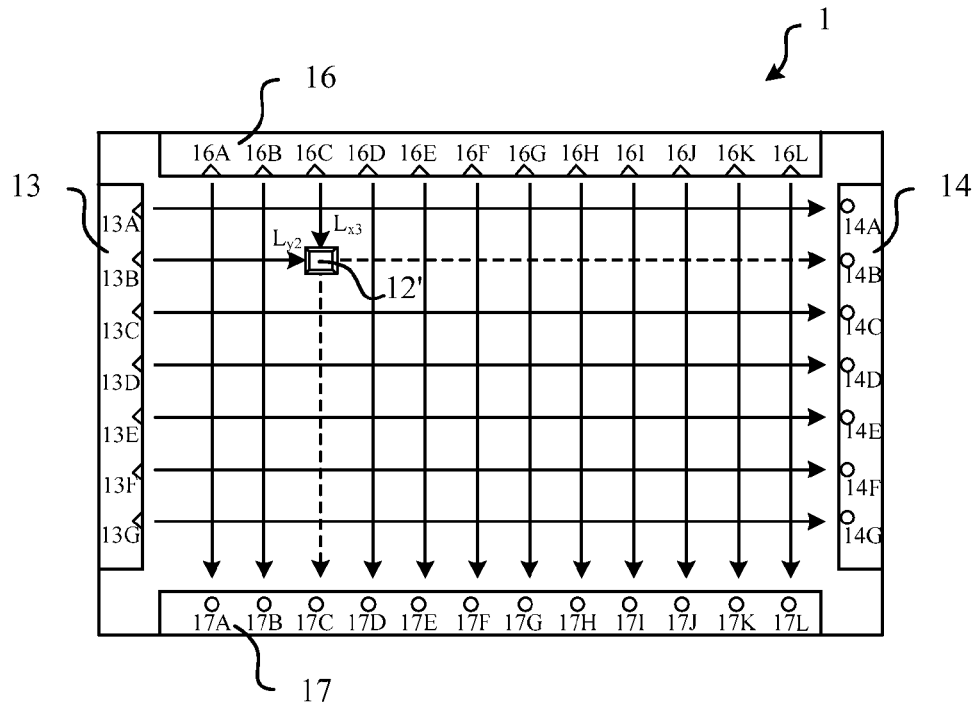

Please refer to FIG. 2A and FIG. 2B. FIG. 2A and FIG. 2B are schematic diagrams illustrating the data inputting apparatus in FIG. 1. As shown in FIG. 2A, the first optical module 13 further includes a plurality of first optical units 13A~13G arranged in the first optical module 13 in sequence, and the first optical units 13A~13G emits the first lights 130 along the first direction, wherein the first lights 130 are respectively corresponding to the keyswitches 12 of data inputting apparatus 1. It should be noted that, in practice, each optical unit can receive the light from a light source and then transfer the light to the first lights, or a plurality of light sources can be configured correspondingly to the light units respectively for providing the first lights.

Similarly, as shown in FIG. 2A, the first sensing module 14 in the embodiment further includes a plurality of first optical sensing units 14A~14G arranged in the first sensing module 14 in sequence. The first optical sensing units 14A~14G are corresponding to the first optical units 13A~13G in sequence, that is to say, the position of the first optical sensing unit 14A is corresponding to the position of the first optical unit 13A, the position of the first optical sensing unit 14B is corresponding to the position of the first optical unit 13B, and so on. Besides, the first optical sensing unit 14A is used for receiving the first light 130 emitted by the first optical unit 13A; the first optical sensing unit 14B is used for receiving the first light 130 emitted by the first optical unit 13B; and so on.

As shown in FIG. 2B, the position of the first keyswitch 12' along the first direction is corresponding to the first optical unit 13B. When a user press the first keyswitch 12', the protruding structure 120' of the first keyswitch 12' blocks the first light 130 (as shown in FIG. 1B) emitted by the first optical unit 13B, so the corresponding first optical sensing unit 14B is unable to receive the first light 130 emitted by the first optical unit 13B, and then the first optical sensing unit 14B sends a non-receiving signal. The first sensing module 14 generates a first sensing result based on the non-receiving signal and the position corresponding to the first optical sensing unit 13B. The first sensing result is that the coordinates, perpendicular to the first direction, of the first keyswitch 12' is determined as $L_{y2}$.

Furthermore, the protruding structure 120 of the keyswitch 12 is a pillar with a rectangular cross-section. The data inputting apparatus 1 further includes a second optical module 16 and a second sensing module 17. As shown in FIG. 2A, the second optical module 16 is disposed on a third side 106 of the data inputting apparatus 1, and the second sensing module 17 is disposed on a fourth side 107 opposite to the third side 106 of the data inputting apparatus 1 and coupled to the processing module 15 in FIG. 1A.

As shown in FIG. 2B, the second optical module 16 can further include a plurality of second optical unit 16A~16L arranged in the second optical module 16 in sequence, and the second sensing module 17 can further include a plurality of second optical sensing units 17A~17L arranged in the second sensing module 17. As the corresponding relation between the first optical units 13A~13G and the first optical sensing units 14A and 14G, the second optical units 16A~16L are also corresponding to the second optical sensing units 17A~17L in sequence. The second optical units 16A~16L can emit second lights 160 along a second direction, and the second optical sensing units 17A~17L can receive the second lights 160 emitted by the second optical units 16A~16L respectively.

As shown in FIG. 2B, the position of the first keyswitch 12' along the second direction is corresponding to the second optical unit 16C. Therefore, when the first keyswitch 12' is pressed, the protruding structure 120' of the first keyswitch 12' blocks the second light 160 emitted by the second optical unit 16C, so the corresponding second optical sensing unit 17C is unable to receive the second light 160 emitted by the second optical unit 16C, and then the second optical sensing unit 17B sends a non-receiving signal. The second sensing module 17 generates a second sensing result based on the non-receiving signal and the position corresponding to the second optical sensing unit 17C to determine the coordinates, perpendicular to the second direction, of the first keyswitch 12' as $L_{x3}$. Therefore, the position of the first keyswitch 120' on the surface of the data inputting apparatus 1 can be defined based on the coordinates $L_{x3}$ and $L_{y2}$.

Figure 3:
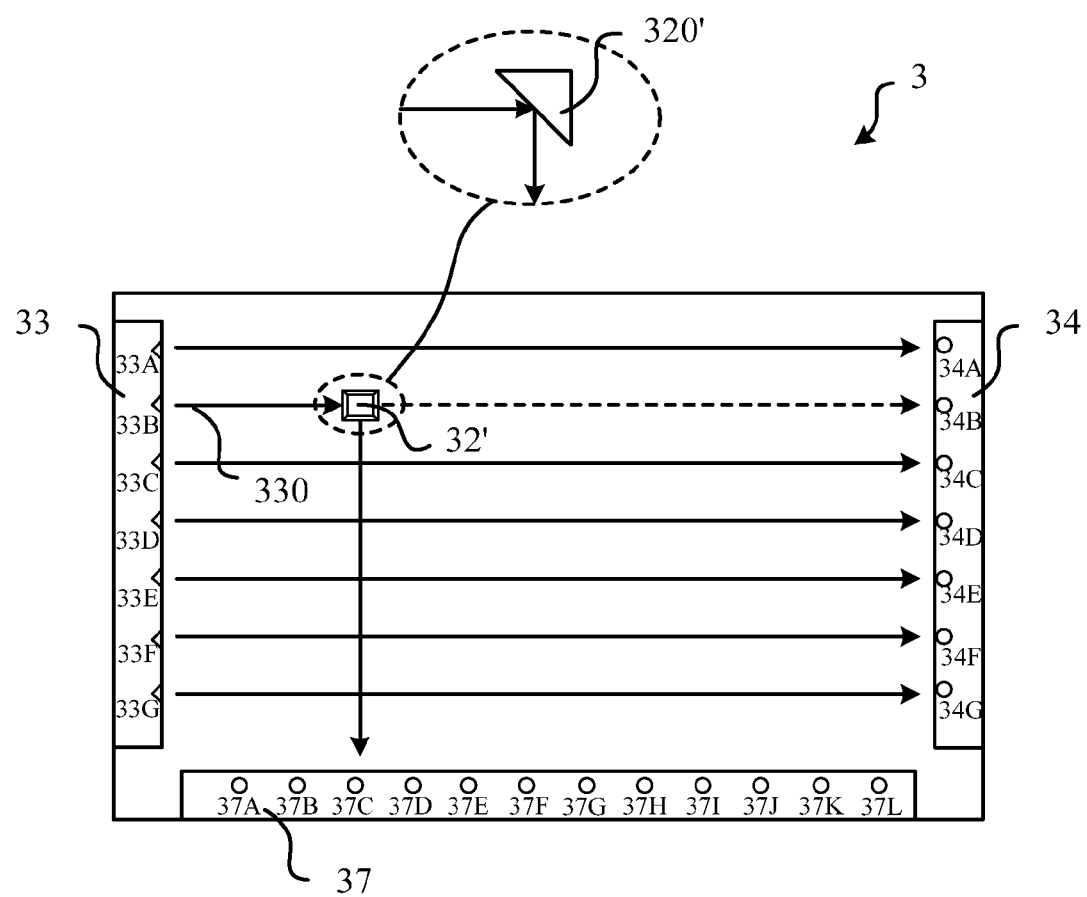
FIG. 3 is a schematic diagram illustrating a data inputting apparatus according to another embodiment of the invention.

Please refer to FIG. 3. FIG. 3 is a schematic diagram illustrating a data inputting apparatus 3 according to another embodiment of the invention. The difference in this embodiment from the above-mentioned embodiment is that the protruding structure under the keyswitch is a pillar with a triangular cross-section. Therefore, the second optical module above-mentioned can be omitted from the data inputting apparatus 3.

As shown in FIG. 3, the first optical module 33 of the data inputting apparatus 3 is disposed on a first side of the data inputting apparatus 3, and the first sensing module 34 is disposed on a second side opposite to the first side of the data inputting apparatus 3 and coupled to a processing module (not shown in the figure). The first optical module 33 is used for emitting first lights 330 along a first direction, and the first sensing module 34 is used for receiving the first lights 330 and generating a first sensing result based on a first receiving state for the first lights 330.

Besides, the data inputting apparatus 3 further include a second sensing module 37 disposed on a third side of the data inputting apparatus 3 and coupled to the processing module. When the first keyswitch 32' is pressed, the protruding structure 320' of the first keyswitch 32' blocks the first light 330 emitted by the first optical module 33, and the first receiving state of the first sensing module 34 is changed (from the state of receiving the first light 330 to the state of non-receiving the first light 330). The first sensing module 34 adjusts the first sensing result based on the first receiving state, and the processing adjusts the position of the first keyswitch 32' based on the first sensing result. At the same time, the triangular cross-section of the protruding structure 320' of the first keyswitch 32' reflects the first light 330 emitted by the first optical module 33 to generate a reflected light along a second direction, and the second sensing module 37 can receive the reflected light and generate a second sensing result based on the reflected light received. Therefore, the processing module can determine the position of the first keyswitch based on the first sensing result and the second sensing result.

In this embodiment, the first optical module 33 can further include a plurality of optical units 33A~33G and a light source (not shown in the figure). The first sensing module 34 can also include a plurality of first optical sensing units 34A~34G. Similarly, the second sensing module 37 can further include a plurality of second optical sensing units 37A~37L. The functions and the relations between the first optical units 33A~33G and the first optical sensing units 34A~34G are substantially the same as those in the above-mentioned embodiment, so the detail would not be described here. The second optical sensing units 37A~37L are used for receiving the reflected lights along the second direction, where the reflected lights are respectively generated by the triangular cross-sections of the protruding structures of the keyswitches reflecting the first lights. One of the second optical sensing units 37A~37L which receives one of the reflected lights sends a receiving signal, and then the second sensing module 37 generates a second sensing result based on the receiving signal and the position corresponding to the second optical sensing unit.

Figure 4A:
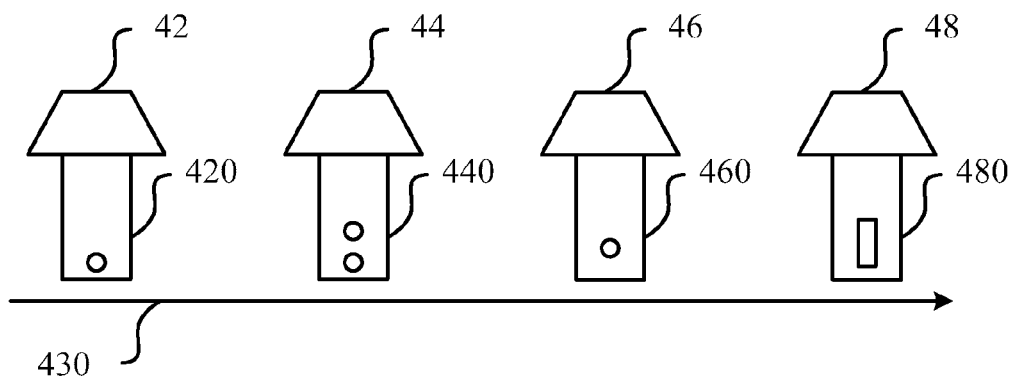
FIG. 4A is a schematic diagram illustrating the keyswitches according to an embodiment of invention.

Please refer to FIG. 4A. FIG. 4A is a schematic diagram illustrating the keyswitches according to an embodiment of invention. As shown in FIG. 4A, the keyswitches 42, 44, 46, and 48 respectively have protruding structures 420, 440, 460, and 480 with different conformations. When the keyswitches are pressed, the protruding structures with different conformations block the first lights at different time to make the first results received by the first sensing module different. Therefore, if each of the keyswitches on the first direction has the protruding structure with different conformation from the others, the first sensing module can determine the coordinates, on the first direction and on the direction perpendicular to the first direction, of the position of the keyswitch, that is to say, the position of the keyswitch on the surface of the data inputting apparatus can be determined. Accordingly, the second optical module and the second sensing module can be omitted to save the cast.

The protruding structure 420 of the keyswitch 42 has a round passing hole for the first light 430 emitted by the first optical module as shown in FIG. 1 to pass through, the protruding structure 440 of the keyswitch 44 has two round passing holes for the first light 430 to pass through, and the protruding structure 460 of the keyswitch 46 has a round passing hole for the first light 430 to pass through, wherein the height of the round passing hole of the protruding structure 460 is different from that of the protruding structure 420. The protruding structure 480 of the keyswitch 48 has a rectangular passing hole as shown in FIG. 4A for the first light 430 to pass through.

Besides, in practice, the passing holes of the protruding structures can be replaced by reflector for reflecting the first lights. The first sensing module can be disposed on the first side where the first optical module in this case for receiving the first lights reflected by the reflector, therefore, when the keyswitch is pressed, the protruding structures with different reflector conformations can reflect the first lights at different time. Accordingly, the position of the keyswitch on the surface of the data inputting apparatus can be determined.

Figure 4B:
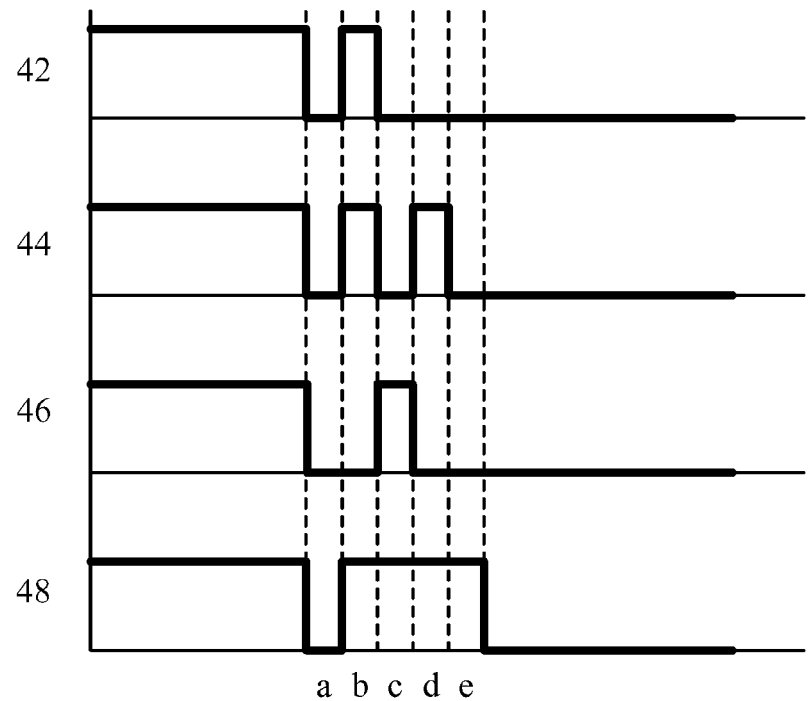
FIG. 4B is a schematic diagram illustrating the first sensing results received by the first sensing module when each keyswitch in FIG. 4A is pressed.

Please refer to FIG. 4B. FIG. 4B is a schematic diagram illustrating the first sensing results received by the first sensing module when each keyswitch in FIG. 4A is pressed. In FIG. 4B, the lowercase letter a, b, c, d and e represent different time periods. As shown in FIG. 4B, when the keyswitch 42 is pressed, the first sensing module only receives the first light during the time period b. When the keyswitch 44 is pressed, the first sensing module receives the first light during the time period b and the time period d. When the keyswitch 46 is pressed, the first sensing module only receives the first light during the time period c. When the keyswitch 48 is pressed, the first sensing module receives the first light during the time range from time period b to time period e. According to the different first sensing results, the first sensing can determine the coordinates, on the first direction and on the direction perpendicular to the first direction, of the position of the keyswitch pressed, and then the position of the keyswitch on the surface of the data inputting apparatus can be determined.

Figure 5:
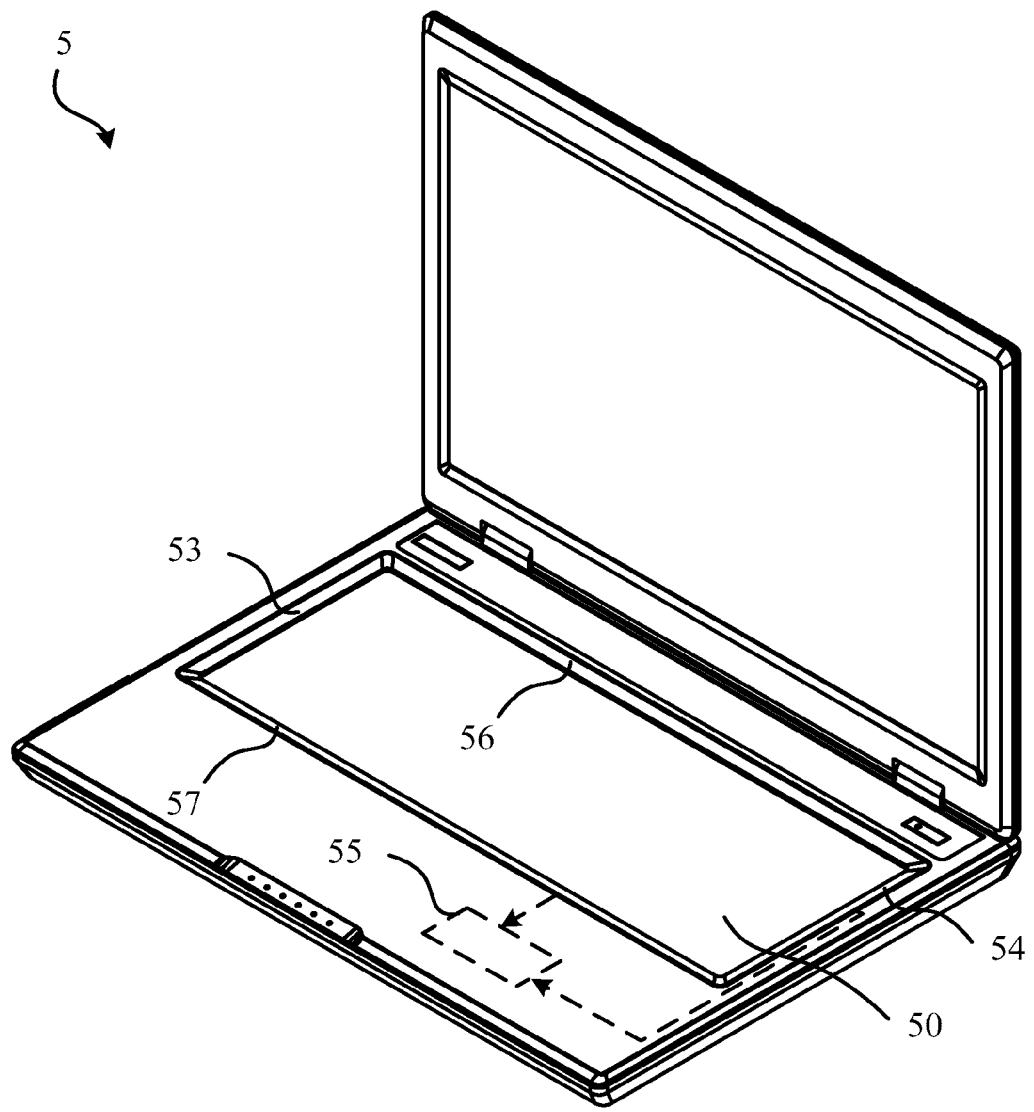
FIG. 5 is a schematic diagram illustrating an electronic apparatus according to an embodiment of the invention.

Please refer to FIG. 5. FIG. 5 is a schematic diagram illustrating an electronic apparatus 5 according to an embodiment of the invention. As shown in FIG. 5, the electronic apparatus 5 includes an input module 50, a first optical module 53, a first sensing module 54, a second optical module 56, a second sensing module 57, and a processing module 55, wherein the processing module 55 is coupled to the first sensing module 54 and the second sensing module 57.

In this embodiment, the input module 50 includes a plurality of keyswitches (not shown in the figure) respectively disposed on the surface of the input module 50, and the keyswitches respectively have a protruding structure (not shown in the figure). The protruding structure is a pillar with a rectangular cross-section. The first optical module 53 is disposed on a first side of the input module 50 for emitting a plurality of first lights, respectively corresponding to the keyswitches, along a first direction. The first sensing module 54 is disposed on a second side opposite to the first side for receiving the first lights 54 and generating a first sensing result based on a first receiving state for the first lights.

The second optical module 56 is disposed on a third side of the input module 50 for emitting a plurality of second lights, respectively corresponding to the keyswitches, along a second direction. The second sensing module 57 is disposed on a fourth side opposite to the third side for receiving the second lights and generating a second sensing result based on a second receiving state for the second lights.

When a first keyswitch of keyswitches is pressed, the protruding structure of the first keyswitch blocks at least one of the first lights resulting in the first receiving state changing, and then the first sensing module 54 adjusts the first sensing result based on the first receiving state. At the same time, the protruding structure of the first keyswitch blocks at least one of the second lights resulting in the second receiving state changing, and then the first sensing module 57 adjusts the second sensing result based on the second receiving state. The processing module 55 determines the position of the first keyswitch based on the first sensing result and the second sensing result.

Furthermore, the first optical module 53 can further includes a plurality of first optical units and a light source. The first optical units can receive the light emitted by the light source and then emit the first lights alone the first direction. The first sensing module 54 also includes a plurality of first optical sensing units. Similarly, the second optical module 56 can further include a plurality of optical units and a light source (this light source could be the same one of the first optical module). The second optical units can receive the light emitted by the light source and then emit the second lights along the second direction. The second sensing module 57 further includes a plurality of second optical sensing units. The functions and relations of the first optical unit, the first optical sensing unit, the second optical unit, and the second optical sensing unit are substantially the same as those in the above-mentioned embodiment, and the detail would not be described here.

If the protruding structure under the keyswitch of the input module 50 is a pillar with a triangular cross-section, the electronic apparatus 5 can omit the second optical module 56. The triangular cross-section of the protruding structure reflects at least one of the first lights to generate a reflected light along the second direction. The second sensing module 57 receives the reflected light and generates the second result based on the reflected light received. The processing module 55 determines the position of the keyswitch on the surface based on the first sensing result and the second sensing result.

The protruding structure under the keyswitch of the input module 50 can be a pillar having a passing hole for the first light to pass through. It should be noted that the keyswitches of the electronic apparatus 5 have the protruding structures having the passing holes with different conformations, therefore, when the keyswitches are pressed, the protruding structures having the different conformations can block the first light at different time to make the first sensing result received by the first sensing module 54 different. Therefore, the first sensing module 54 can determine the position of the keyswitches on the surface of the input module 50 based on the different first sensing result. Accordingly, the second optical module 56 and the second sensing module 57 can be omitted to save the cost.

Besides, in practice, the passing holes above-mentioned can be replaced by reflectors for reflecting the first lights. The first sensing module 54 can be disposed on the first side of the input module 50 where the first optical module 53 is disposed for receiving the first lights reflected by the reflectors. Therefore, when the keyswitches are pressed, the protruding structures having different reflectors reflect the first light at different time. Accordingly, the position of the keyswitch on the surface of the input module 50 can be determined.

As described above, the keyswitch pressed can be easily detected by the user through the light emitting unit and the photoelectrical sensing unit according to the data inputting apparatus and the electronic apparatus. Besides the space problem of the traditional keyboard can be solved, the complex construction and circuit under the keyswitches are unnecessary in the data inputting apparatus of the invention so as to simplify the construction and save the cost.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A data inputting apparatus, comprising:
   a plurality of keyswitches, disposed on the data inputting apparatus, the keyswitches respectively having a protruding structure;
   a first optical module, disposed on a first side of the data inputting apparatus, the first optical module being used for emitting a plurality of first lights along a first direction, the first lights being corresponding to the keyswitches respectively;
   a first sensing module, used for receiving the first lights and generating a first sensing result based on a first receiving state for the first lights; and
   a processing module, coupled to the first sensing module, wherein, when a first keyswitch of the keyswitches is pressed, the protruding structure of the first keyswitch blocks at least one of the first lights resulting in the first receiving state changing, the first sensing module adjusts the first sensing result based on the first receiving state; and
   wherein the protruding structure has at least one passing hole for the first light to pass through, when the first keyswitch is pressed, the protruding structure having the passing hole blocks at least one of the first lights at a specific time and allows other lights to pass through in at least one time period resulting in the first receiving state changing, and the processing module determines the position of the first keyswitch based on the first sensing result generated from a timing of the at least one time period.

2. An electronic apparatus, comprising:
   an input module, comprising a plurality of keyswitch, the keyswitches respectively having a protruding structure;
   a first optical module, disposed on a first side of the input module and used for emitting a plurality of first lights along a first direction, the first lights being corresponding to the keyswitches respectively;
   a first sensing module, used for receiving the first lights and generating a first sensing result based on a first receiving state for the first lights; and
   a processing module, coupled to the first sensing module, wherein, when a first keyswitch of the keyswitches is pressed, the protruding structure of the first keyswitch blocks at least one of the first lights resulting in the first receiving state changing, the first sensing module adjusts the first sensing result based on the first receiving state; and
   wherein the protruding structure has at least one passing hole for the first light to pass through, when the first keyswitch is pressed, the protruding structure having the passing hole blocks at least one of the first lights at a specific time and allows other lights to pass through in at least one time period resulting in the first receiving state changing, and the processing module determines the position of the first keyswitch based on the first sensing result generated from a timing of the at least one time period.

* * * * *